United States Patent
Zhang et al.

(10) Patent No.: US 10,781,349 B2
(45) Date of Patent: Sep. 22, 2020

(54) THERMAL INTERFACE MATERIAL INCLUDING CROSSLINKER AND MULTIPLE FILLERS

(71) Applicants: Honeywell International Inc., Morris Plains, NJ (US); Liqiang Zhang, Shanghai (CN); Wei Jun Wang, Shanghai (CN); Ya Qun Liu, Shanghai (CN); Hong Min Huang, Shanghai (CN)

(72) Inventors: Liqiang Zhang, Shanghai (CN); Wei Jun Wang, Shanghai (CN); Ya Qun Liu, Shanghai (CN); Hong Min Huang, Shanghai (CN)

(73) Assignee: Honeywell International Inc., Charlotte, NC (US)

( * ) Notice: Subject to any disclaimer, the term of this patent is extended or adjusted under 35 U.S.C. 154(b) by 22 days.

(21) Appl. No.: 16/081,649

(22) PCT Filed: Mar. 8, 2016

(86) PCT No.: PCT/CN2016/075827
§ 371 (c)(1),
(2) Date: Aug. 31, 2018

(87) PCT Pub. No.: WO2017/152353
PCT Pub. Date: Sep. 14, 2017

(65) Prior Publication Data
US 2019/0085225 A1    Mar. 21, 2019

(51) Int. Cl.
*H01L 23/373* (2006.01)
*C09K 5/06* (2006.01)
(Continued)

(52) U.S. Cl.
CPC .......... *C09K 5/063* (2013.01); *H01L 23/3675* (2013.01); *H01L 23/3737* (2013.01);
(Continued)

(58) Field of Classification Search
CPC . H01L 23/3737; H01L 23/4275; H01L 24/29; H01L 24/32; C09K 5/063
See application file for complete search history.

(56) References Cited

U.S. PATENT DOCUMENTS

| 1,655,133 A | 1/1928 | Clase |
| 2,451,600 A | 10/1948 | Woodcock |

(Continued)

FOREIGN PATENT DOCUMENTS

| CA | 2311067 A1 | 1/2001 |
| CA | 2433637 A1 | 12/2002 |

(Continued)

OTHER PUBLICATIONS

"Dynasylan 1146: Oligomeric Diamino-Silane-System" Evonik Industries, pp. 1-3, 2008.
(Continued)

*Primary Examiner* — George R Fourson, III
(74) *Attorney, Agent, or Firm* — Faegre Drinker Biddle & Reath LLP

(57) ABSTRACT

A thermal interface material includes, in one exemplary embodiment, at least one polymer, at least one phase change material, at least one crosslinker, and at least one thermally conductive filler. The at least one thermally conductive includes a first plurality of particles having a particle diameter of about 1 micron or less. The at least one thermally conductive filler comprises at least 80 wt. % of the total weight of the thermal interface material. A formulation for
(Continued)

forming a thermal interface material and an electronic component including a thermal interface material are also provided.

15 Claims, 2 Drawing Sheets

(51) Int. Cl.
*H01L 23/367* (2006.01)
*H01L 23/00* (2006.01)
*H01L 23/498* (2006.01)
*H01L 23/42* (2006.01)

(52) U.S. Cl.
CPC .............. *H01L 24/29* (2013.01); *H01L 24/32* (2013.01); *H01L 23/42* (2013.01); *H01L 23/49827* (2013.01); *H01L 2224/16225* (2013.01); *H01L 2224/2929* (2013.01); *H01L 2224/29324* (2013.01); *H01L 2224/29386* (2013.01); *H01L 2224/32225* (2013.01); *H01L 2224/32245* (2013.01); *H01L 2224/73204* (2013.01); *H01L 2224/73253* (2013.01); *H01L 2924/0542* (2013.01)

(56) References Cited

U.S. PATENT DOCUMENTS

| | | |
|---|---|---|
| 2,810,203 A | 10/1957 | Bachofer |
| 3,262,997 A | 7/1966 | Cameron et al. |
| 4,006,530 A | 2/1977 | Nicolas |
| 4,087,918 A | 5/1978 | Schmid et al. |
| 4,180,498 A | 12/1979 | Spivack |
| 4,265,026 A | 5/1981 | Meyer |
| 4,446,266 A | 5/1984 | von Gentzkow et al. |
| 4,459,185 A | 7/1984 | Obata et al. |
| 4,559,709 A | 12/1985 | Beseme et al. |
| 4,565,610 A | 1/1986 | Nobel et al. |
| 4,604,424 A | 8/1986 | Cole et al. |
| 4,787,149 A | 11/1988 | Possati et al. |
| 4,816,086 A | 3/1989 | Oleske |
| 4,832,781 A | 5/1989 | Mears |
| 4,839,955 A | 6/1989 | Vannier |
| 4,910,050 A | 3/1990 | Oldham et al. |
| 5,162,555 A | 11/1992 | Remmers et al. |
| 5,167,851 A | 12/1992 | Jamison et al. |
| 5,294,923 A | 3/1994 | Juergens et al. |
| 5,391,924 A | 2/1995 | Uchida et al. |
| 5,403,580 A | 4/1995 | Bujanowski et al. |
| 5,562,814 A | 10/1996 | Kirby |
| 5,660,917 A | 8/1997 | Fujimori et al. |
| 5,816,699 A | 10/1998 | Keith et al. |
| 5,930,115 A | 7/1999 | Tracy et al. |
| 5,950,066 A | 9/1999 | Hanson et al. |
| 6,040,362 A | 3/2000 | Mine et al. |
| 6,054,198 A | 4/2000 | Bunyan et al. |
| 6,090,484 A | 7/2000 | Bergerson |
| 6,096,414 A | 8/2000 | Young |
| 6,165,612 A | 12/2000 | Misra |
| 6,197,859 B1 | 3/2001 | Hanson et al. |
| 6,238,596 B1 | 5/2001 | Nguyen et al. |
| 6,339,120 B1 | 1/2002 | Misra et al. |
| 6,372,337 B2 | 4/2002 | Takahashi et al. |
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 | 9/2002 | Nguyen |
| 6,475,962 B1 | 11/2002 | Khatri |
| 6,496,373 B1 | 12/2002 | Chung |
| 6,500,891 B1 | 12/2002 | Kropp et al. |
| 6,506,332 B2 | 1/2003 | Pedigo |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,645,643 B2 | 11/2003 | Zafarana et al. |
| 6,649,325 B1 | 11/2003 | Gundale et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |
| 6,811,725 B2 | 11/2004 | Nguyen et al. |
| 6,815,486 B2 | 11/2004 | Bhagwagar et al. |
| 6,835,453 B2 | 12/2004 | Greenwood et al. |
| 6,838,182 B2 | 1/2005 | Kropp et al. |
| 6,841,757 B2 | 1/2005 | Marega et al. |
| 6,874,573 B2 | 4/2005 | Collins et al. |
| 6,900,163 B2 | 5/2005 | Khatri |
| 6,901,675 B2 | 6/2005 | Edwards et al. |
| 6,908,669 B2 | 6/2005 | Nguyen |
| 6,908,682 B2 | 6/2005 | Mistele |
| 6,913,686 B2 | 7/2005 | Hilgarth |
| 6,921,780 B2 | 7/2005 | Ducros et al. |
| 6,924,027 B2 | 8/2005 | Matayabas et al. |
| 6,926,955 B2 | 8/2005 | Jayaraman et al. |
| 6,940,721 B2 | 9/2005 | Hill |
| 6,946,190 B2 | 9/2005 | Bunyan |
| 6,956,739 B2 | 10/2005 | Bunyan |
| 6,975,944 B1 | 12/2005 | Zenhausern |
| 6,984,685 B2 | 1/2006 | Misra et al. |
| 7,013,965 B2 | 3/2006 | Zhong et al. |
| 7,038,009 B2 | 5/2006 | Sagal et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,119,143 B2 | 10/2006 | Jarnjevic et al. |
| 7,135,232 B2 | 11/2006 | Yamada et al. |
| 7,147,367 B2 | 12/2006 | Balian et al. |
| 7,172,711 B2 | 2/2007 | Nguyen |
| 7,208,191 B2 | 4/2007 | Freedman |
| 7,241,707 B2 | 7/2007 | Meagley et al. |
| 7,244,491 B2 | 7/2007 | Nguyen |
| 7,253,523 B2 | 8/2007 | Dani et al. |
| 7,262,369 B1 | 8/2007 | English |
| 7,291,396 B2 | 11/2007 | Huang et al. |
| 7,294,394 B2 | 11/2007 | Jayaraman et al. |
| RE39,992 E | 1/2008 | Misra et al. |
| 7,326,042 B2 | 2/2008 | Alper et al. |
| 7,328,547 B2 | 2/2008 | Mehta et al. |
| 7,369,411 B2 | 5/2008 | Hill et al. |
| 7,440,281 B2 | 10/2008 | Bailey et al. |
| 7,446,158 B2 | 11/2008 | Okamoto et al. |
| 7,462,294 B2 | 12/2008 | Kumar et al. |
| 7,463,496 B2 | 12/2008 | Robinson et al. |
| 7,465,605 B2 | 12/2008 | Raravikar et al. |
| 7,538,075 B2 | 5/2009 | Yamada et al. |
| 7,550,097 B2 | 6/2009 | Tonapi et al. |
| 7,572,494 B2 | 8/2009 | Mehta et al. |
| 7,608,324 B2 | 10/2009 | Nguyen et al. |
| 7,641,811 B2 | 1/2010 | Kumar et al. |
| 7,646,778 B2 | 1/2010 | Sajassi |
| 7,682,690 B2 | 3/2010 | Bunyan et al. |
| 7,695,817 B2 | 4/2010 | Lin et al. |
| 7,700,943 B2 | 4/2010 | Raravikar et al. |
| 7,732,829 B2 | 6/2010 | Murphy |
| 7,744,991 B2 | 6/2010 | Fischer et al. |
| 7,763,673 B2 | 7/2010 | Okamoto et al. |
| RE41,576 E | 8/2010 | Bunyan et al. |
| 7,765,811 B2 | 8/2010 | Hershberger et al. |
| 7,807,756 B2 | 10/2010 | Wakabayashi et al. |
| 7,816,785 B2 | 10/2010 | Iruvanti et al. |
| 7,842,381 B2 | 11/2010 | Johnson |

(56) References Cited

U.S. PATENT DOCUMENTS

| | | |
|---|---|---|
| 7,846,778 B2 | 12/2010 | Rumer et al. |
| 7,850,870 B2 | 12/2010 | Ahn et al. |
| 7,867,609 B2 | 1/2011 | Nguyen |
| 7,893,170 B2 | 2/2011 | Wakioka et al. |
| 7,955,900 B2 | 6/2011 | Jadhav et al. |
| 7,960,019 B2 | 6/2011 | Jayaraman et al. |
| 7,973,108 B2 | 7/2011 | Okamoto et al. |
| 8,009,429 B1 | 8/2011 | Sundstrom et al. |
| 8,039,961 B2 | 10/2011 | Suhir et al. |
| 8,076,773 B2 | 12/2011 | Jewram et al. |
| 8,081,468 B2 | 12/2011 | Hill et al. |
| 8,102,058 B2 | 1/2012 | Hsieh et al. |
| 8,105,504 B2 | 1/2012 | Gerster et al. |
| 8,110,919 B2 | 2/2012 | Jewram et al. |
| 8,112,884 B2 | 2/2012 | Tullidge et al. |
| 8,115,303 B2 | 2/2012 | Bezama et al. |
| 8,138,239 B2 | 3/2012 | Prack et al. |
| 8,167,463 B2 | 5/2012 | Loh |
| 8,223,498 B2 | 7/2012 | Lima |
| 8,308,861 B2 | 11/2012 | Rolland et al. |
| 8,324,313 B2 | 12/2012 | Funahashi |
| 8,362,607 B2 | 1/2013 | Scheid et al. |
| 8,373,283 B2 | 2/2013 | Masuko et al. |
| 8,431,647 B2 | 4/2013 | Dumont et al. |
| 8,431,655 B2 | 4/2013 | Dershem |
| 8,445,102 B2 | 5/2013 | Strader et al. |
| 8,518,302 B2 | 8/2013 | Gerster et al. |
| 8,535,478 B2 | 9/2013 | Pouchelon et al. |
| 8,535,787 B1 | 9/2013 | Lima |
| 8,557,896 B2 | 10/2013 | Jeong et al. |
| 8,586,650 B2 | 11/2013 | Zhang et al. |
| 8,587,945 B1 | 11/2013 | Hartmann et al. |
| 8,618,211 B2 | 12/2013 | Bhagwagar et al. |
| 8,632,879 B2 | 1/2014 | Weisenberger |
| 8,633,478 B2 | 1/2014 | Cummings et al. |
| 8,638,001 B2 | 1/2014 | Kimura et al. |
| 8,647,752 B2 | 2/2014 | Strader et al. |
| 8,758,892 B2 | 6/2014 | Bergin et al. |
| 8,796,068 B2 | 8/2014 | Stender et al. |
| 8,837,151 B2 | 9/2014 | Hill et al. |
| 8,865,800 B2 | 10/2014 | Stammer et al. |
| 8,917,510 B2 | 12/2014 | Boday et al. |
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,353,304 B2 | 5/2016 | Merrill et al. |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,155,894 B2 | 12/2018 | Liu et al. |
| 10,287,471 B2 | 5/2019 | Zhang et al. |
| 10,312,177 B2 | 6/2019 | Zhang et al. |
| 10,501,671 B2 | 12/2019 | Zhang et al. |
| 2002/0018885 A1 | 2/2002 | Takahashi et al. |
| 2002/0132896 A1* | 9/2002 | Nguyen ............... B32B 27/12 524/404 |
| 2002/0140082 A1 | 10/2002 | Matayabas |
| 2002/0143092 A1 | 10/2002 | Matayabas |
| 2003/0031876 A1 | 2/2003 | Obeng et al. |
| 2003/0068487 A1 | 4/2003 | Nguyen et al. |
| 2003/0112603 A1 | 6/2003 | Roesner et al. |
| 2003/0128521 A1 | 7/2003 | Matayabas et al. |
| 2003/0151030 A1 | 8/2003 | Gurin |
| 2003/0159938 A1 | 8/2003 | Hradil |
| 2003/0171487 A1 | 9/2003 | Ellsworth et al. |
| 2003/0178139 A1 | 9/2003 | Clouser et al. |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0037965 A1 | 2/2004 | Salter |
| 2004/0053059 A1 | 3/2004 | Mistele |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0045855 A1 | 3/2005 | Tonapi et al. |
| 2005/0072334 A1 | 4/2005 | Czubarow et al. |
| 2005/0110133 A1 | 5/2005 | Yamada et al. |
| 2005/0148721 A1 | 7/2005 | Tonapi et al. |
| 2005/0228097 A1 | 10/2005 | Zhong |
| 2005/0256291 A1 | 11/2005 | Okamoto et al. |
| 2005/0287362 A1 | 12/2005 | Garcia-Ramirez et al. |
| 2006/0040112 A1* | 2/2006 | Dean ............... H01L 23/3735 428/447 |
| 2006/0057364 A1 | 3/2006 | Nguyen |
| 2006/0094809 A1 | 5/2006 | Simone et al. |
| 2006/0122304 A1 | 6/2006 | Matayabas, Jr. |
| 2006/0155029 A1 | 7/2006 | Zucker |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0013054 A1 | 1/2007 | Ruchert et al. |
| 2007/0051773 A1* | 3/2007 | Ruchert ............ H01L 23/4275 228/101 |
| 2007/0097651 A1 | 5/2007 | Canale et al. |
| 2007/0116626 A1 | 5/2007 | Pan et al. |
| 2007/0131913 A1 | 6/2007 | Cheng et al. |
| 2007/0161521 A1 | 7/2007 | Sachdev et al. |
| 2007/0164424 A1* | 7/2007 | Dean ................. H01L 23/10 257/707 |
| 2007/0166554 A1 | 7/2007 | Ruchert et al. |
| 2007/0179232 A1 | 8/2007 | Collins et al. |
| 2007/0219312 A1 | 9/2007 | David |
| 2007/0241303 A1 | 10/2007 | Zhong et al. |
| 2007/0241307 A1 | 10/2007 | Nguyen |
| 2007/0249753 A1 | 10/2007 | Lin et al. |
| 2007/0293604 A1 | 12/2007 | Frenkel et al. |
| 2008/0021146 A1 | 1/2008 | Komatsu et al. |
| 2008/0023665 A1 | 1/2008 | Weiser et al. |
| 2008/0044670 A1 | 2/2008 | Nguyen |
| 2008/0110609 A1* | 5/2008 | Fann ................. C22C 12/00 165/185 |
| 2008/0116416 A1 | 5/2008 | Chacko |
| 2008/0141629 A1 | 6/2008 | Alper et al. |
| 2008/0149176 A1 | 6/2008 | Sager et al. |
| 2008/0269405 A1 | 10/2008 | Okamoto et al. |
| 2008/0291634 A1 | 11/2008 | Weiser et al. |
| 2008/0302064 A1 | 12/2008 | Rauch |
| 2009/0053515 A1 | 2/2009 | Luo et al. |
| 2009/0072408 A1 | 3/2009 | Kabir et al. |
| 2009/0111925 A1 | 4/2009 | Burnham et al. |
| 2009/0184283 A1 | 7/2009 | Chung et al. |
| 2010/0040768 A1 | 2/2010 | Dhindsa |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2010/0256280 A1 | 10/2010 | Bruzda |
| 2010/0304152 A1 | 12/2010 | Clarke |
| 2011/0000516 A1 | 1/2011 | Hershberger et al. |
| 2011/0038124 A1 | 2/2011 | Burnham et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0192564 A1 | 8/2011 | Mommer et al. |
| 2011/0204280 A1 | 8/2011 | Bruzda |
| 2011/0205708 A1 | 8/2011 | Andry et al. |
| 2011/0265979 A1 | 11/2011 | Chen et al. |
| 2011/0294958 A1 | 12/2011 | Ahn et al. |
| 2011/0308782 A1* | 12/2011 | Merrill .................. C09K 5/08 165/185 |

(56) References Cited

U.S. PATENT DOCUMENTS

| | | | |
|---|---|---|---|
| 2012/0048528 | A1 | 3/2012 | Bergin et al. |
| 2012/0060826 | A1 | 3/2012 | Weisenberger |
| 2012/0087094 | A1 | 4/2012 | Hill et al. |
| 2012/0142832 | A1 | 6/2012 | Varma et al. |
| 2012/0174956 | A1 | 7/2012 | Smythe et al. |
| 2012/0182693 | A1 | 7/2012 | Boday et al. |
| 2012/0195822 | A1 | 8/2012 | Werner et al. |
| 2012/0253033 | A1 | 10/2012 | Boucher et al. |
| 2012/0280382 | A1 | 11/2012 | Im et al. |
| 2012/0285673 | A1 | 11/2012 | Cola et al. |
| 2012/0288725 | A1 | 11/2012 | Tanaka et al. |
| 2012/0292005 | A1 | 11/2012 | Bruzda et al. |
| 2013/0127069 | A1 | 5/2013 | Boday |
| 2013/0199724 | A1 | 8/2013 | Dershem |
| 2013/0248163 | A1 | 9/2013 | Bhagwagar et al. |
| 2013/0265721 | A1 | 10/2013 | Strader et al. |
| 2013/0285233 | A1 | 10/2013 | Bao et al. |
| 2013/0288462 | A1 | 10/2013 | Stender et al. |
| 2013/0299140 | A1 | 11/2013 | Ling et al. |
| 2014/0043754 | A1 | 2/2014 | Hartmann et al. |
| 2014/0190672 | A1 | 7/2014 | Swaroop et al. |
| 2014/0264818 | A1 | 9/2014 | Lowe et al. |
| 2015/0000151 | A1 | 1/2015 | Roth et al. |
| 2015/0125646 | A1 | 5/2015 | Tournilhac et al. |
| 2015/0138739 | A1 | 5/2015 | Hishiki |
| 2015/0158982 | A1 | 6/2015 | Saito et al. |
| 2015/0183951 | A1 | 7/2015 | Bhagwagar et al. |
| 2015/0275060 | A1 | 10/2015 | Kuroda et al. |
| 2015/0279762 | A1 | 10/2015 | Lowe et al. |
| 2015/0307743 | A1 | 10/2015 | Ireland et al. |
| 2016/0160102 | A1 | 6/2016 | Minegishi et al. |
| 2016/0160104 | A1 | 6/2016 | Bruzda et al. |
| 2016/0226114 | A1 | 8/2016 | Hartmann et al. |
| 2016/0272839 | A1 | 9/2016 | Yamamoto et al. |
| 2017/0009362 | A1 | 1/2017 | Werner et al. |
| 2017/0018481 | A1 | 1/2017 | Zeng et al. |
| 2017/0107415 | A1 | 4/2017 | Shiono |
| 2017/0137685 | A1 | 5/2017 | Liu et al. |
| 2017/0167716 | A1 | 6/2017 | Ezaki et al. |
| 2017/0226396 | A1 | 8/2017 | Yang et al. |
| 2017/0243849 | A1 | 8/2017 | Sasaki et al. |
| 2017/0317257 | A1 | 11/2017 | Ezaki et al. |
| 2017/0321100 | A1 | 11/2017 | Zhang et al. |
| 2018/0030327 | A1 | 2/2018 | Zhang et al. |
| 2018/0030328 | A1 | 2/2018 | Zhang et al. |
| 2018/0085977 | A1 | 3/2018 | Ezaki |
| 2018/0194982 | A1 | 7/2018 | Ezaki et al. |
| 2018/0267315 | A1 | 9/2018 | Yonemura |
| 2018/0358283 | A1 | 12/2018 | Zhang et al. |
| 2018/0370189 | A1 | 12/2018 | Tang et al. |
| 2019/0048245 | A1 | 2/2019 | Liu et al. |
| 2019/0078007 | A1 | 3/2019 | Zhang et al. |
| 2019/0092993 | A1 | 3/2019 | Naik et al. |
| 2019/0119544 | A1 | 4/2019 | Shen et al. |
| 2019/0122954 | A1* | 4/2019 | Bruzda .................. H01L 23/42 |
| 2019/0249007 | A1 | 8/2019 | Shen et al. |

FOREIGN PATENT DOCUMENTS

| | | |
|---|---|---|
| CN | 1407141 A | 4/2003 |
| CN | 1456710 A | 11/2003 |
| CN | 1549875 A | 11/2004 |
| CN | 1580116 A | 2/2005 |
| CN | 1970666 A | 5/2007 |
| CN | 1972988 A | 5/2007 |
| CN | 101067030 A | 11/2007 |
| CN | 101090922 B | 12/2007 |
| CN | 101113241 A | 1/2008 |
| CN | 101126016 A | 2/2008 |
| CN | 100394566 C | 6/2008 |
| CN | 101288353 A | 10/2008 |
| CN | 101445627 A | 6/2009 |
| CN | 101525489 A | 9/2009 |
| CN | 101735619 B | 6/2010 |
| CN | 101835830 B | 9/2010 |
| CN | 101942197 A | 1/2011 |
| CN | 102134474 B | 7/2011 |
| CN | 102341474 B | 2/2012 |
| CN | 102627943 A | 8/2012 |
| CN | 102634212 A | 8/2012 |
| CN | 102348763 B | 4/2013 |
| CN | 103087389 A | 5/2013 |
| CN | 103102552 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103756631 A | 4/2014 |
| CN | 103773322 A | 5/2014 |
| CN | 103849356 A | 6/2014 |
| CN | 103865271 B | 6/2014 |
| CN | 104098914 A | 10/2014 |
| CN | 104140678 B | 11/2014 |
| CN | 104152103 A | 11/2014 |
| CN | 104194733 A | 12/2014 |
| CN | 104449550 A | 3/2015 |
| CN | 104497574 A | 4/2015 |
| CN | 104513487 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105419339 A | 3/2016 |
| CN | 104479623 B | 5/2016 |
| CN | 105566920 A | 5/2016 |
| CN | 105670555 A | 6/2016 |
| CN | 103923463 B | 8/2016 |
| CN | 105838322 A | 8/2016 |
| CN | 105925243 A | 9/2016 |
| CN | 105980512 A | 9/2016 |
| CN | 106221236 A | 12/2016 |
| CN | 106243720 A | 12/2016 |
| CN | 107057370 A | 8/2017 |
| DE | 102007037435 A1 | 2/2009 |
| DE | 102009001722 A1 | 9/2010 |
| EP | 0816423 A1 | 1/1998 |
| EP | 1224669 B1 | 7/2002 |
| EP | 1291913 A2 | 3/2003 |
| EP | 1414063 A2 | 4/2004 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 0543116 B2 | 5/1986 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 2003-218296 A | 7/2003 |
| JP | 100479857 B1 | 7/2003 |
| JP | 2005-032468 A | 2/2005 |
| JP | 2006-502248 A | 1/2006 |
| JP | 2007002002 A | 1/2007 |
| JP | 2007-106809 A | 4/2007 |
| JP | 2007-131798 A | 5/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 4480457 B2 | 6/2010 |
| JP | 5390202 B2 | 8/2010 |
| JP | 2010-248349 A | 11/2010 |

(56) References Cited

FOREIGN PATENT DOCUMENTS

| | | |
|---|---|---|
| JP | 2010248277 A | 11/2010 |
| JP | 2010278115 A | 12/2010 |
| JP | 5318733 B2 | 6/2011 |
| JP | 2011165792 A | 8/2011 |
| JP | 2012-119725 A | 6/2012 |
| JP | 5687167 B2 | 4/2013 |
| JP | 5463116 B2 | 4/2014 |
| JP | 2014-105283 A | 6/2014 |
| JP | 5944306 B2 | 7/2014 |
| JP | 5372270 B1 | 9/2014 |
| JP | 2014194006 A | 10/2014 |
| JP | 2015-212318 A | 11/2015 |
| KR | 20070116654 A | 12/2007 |
| KR | 10-0820902 B1 | 4/2008 |
| KR | 0953679 B1 | 4/2010 |
| KR | 1175948 B1 | 8/2012 |
| KR | 10-2015-0049376 A | 5/2015 |
| TW | 569348 13 | 1/2004 |
| TW | 200907040 A | 2/2009 |
| TW | 201033268 A | 9/2010 |
| TW | 201527309 A | 7/2015 |
| TW | 201546257 A | 12/2015 |
| WO | 87/06492 A1 | 11/1987 |
| WO | 1997026297 A1 | 7/1997 |
| WO | WO0120618 A1 | 3/2001 |
| WO | 01/93648 A2 | 12/2001 |
| WO | WO03052818 A1 | 6/2003 |
| WO | 2003064148 A1 | 8/2003 |
| WO | 2004008497 A2 | 1/2004 |
| WO | 2004022330 A1 | 3/2004 |
| WO | WO2005021257 A1 | 3/2005 |
| WO | 2005/111146 A1 | 11/2005 |
| WO | 200511146 A1 | 11/2005 |
| WO | 2005119771 A1 | 12/2005 |
| WO | 2006/014171 A1 | 2/2006 |
| WO | WO2006023860 A2 | 3/2006 |
| WO | 2007027670 A1 | 3/2007 |
| WO | 2008014171 A2 | 1/2008 |
| WO | WO2008103219 A1 | 8/2008 |
| WO | 2008121491 A1 | 10/2008 |
| WO | 2008121970 A1 | 10/2008 |
| WO | 2009032212 A1 | 3/2009 |
| WO | 2010/104534 A1 | 9/2010 |
| WO | 2010/104542 A1 | 9/2010 |
| WO | 2013/074920 A1 | 5/2013 |
| WO | 2013191116 A1 | 12/2013 |
| WO | 2014007119 A1 | 1/2014 |
| WO | 2014/021980 A1 | 2/2014 |
| WO | 2014160067 A1 | 10/2014 |
| WO | 2015/120773 A1 | 8/2015 |
| WO | 2015179056 A1 | 11/2015 |
| WO | 2016004565 A1 | 1/2016 |
| WO | 2016103424 A1 | 6/2016 |
| WO | 2018/022288 A2 | 2/2018 |
| WO | 2018/022293 A2 | 2/2018 |
| WO | WO2018068222 A1 | 4/2018 |

OTHER PUBLICATIONS

"Hi-Flow 225F-AC Reinforced, Phase Change Thermal Interface Material," The Bergquist Company, 1 page, available at least as early as Aug. 31, 2017.
"Semicosil 9212A." Wacker Silicones Material Safety Data Sheet, pp. 1-8, printed Dec. 11, 2009.
"Semicosil 9212B." Wacker Silicones Material Safety Data Sheet, pp. 1-8, printed Dec. 11, 2009.
"Therm-A-Gap HCS10,569,570,579 and 580 Thermally Conductive Gap Filler Pads," Parker Chomerics, Engineering Your Success, pp. 11-12, available at least as early as the filed of the present application.
Aranzabe, Estibaliz, et al. "More than Color: Pigments with Thermal Storage Capacity; Processing and Degradation Behavior." Advances in Materials Physics and Chemistry, 5:171-184, 2015.
Extended European Search Report issued in EP Application 14867847.7, dated Jun. 26, 2017, 7 pages.
Extended European Search Report issued in EP Application No. 14897036.1, dated Jul. 2, 2018, 7 pages.
Extended Search Report issued in EP Application 14907530.1, dated Jun. 27, 2018, 9 pages.
Fink, Johannes Karl. "Chapter 18: Metal Deactivators." in: A Concise Introduction to Additives for Thermoplastic Polymers, Wiley-Scrivener, pp. 165-171, Jan. 1, 2010.
Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.
International Preliminary Report on Patentability issued in PCT/CN2016/075827, dated Sep. 20, 2018, 5 pages.
International Search Report and Written Opinion issued in PCT/CN2014/081724, dated Apr. 1, 2015, 12 pages.
International Search Report and Written Opinion issued in PCT/CN2014/093138, dated Sep. 6, 2015, 8 pages.
International Search Report and Written Opinion issued in PCT/US2014/068033, dated Mar. 26, 2015, 12 pages.
International Search Report and Written Opinion issued in PCT/US2017/041498, dated Oct. 20, 2017, 10 pages.
Martyak et al., On the oxidation of tin(II) in methanesulfonate solutions and the role of sulfate, Galvanotechnik (2005), 96(3), 594-601 (Abstract).
Ping, Ding, et al. "Preparation and Application Research of Novel Silicone Gel for High-Power IGBT." Insulating Materials, 47(2):52-55, Chinese text with English translation of Abstract, 2014.
Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.
Search Report issued in CN application 201480066502.2, dated May 18, 2017, 2 pages.
Singaporean Search Report and Written Opinion issued in SG Application No. 11201704238Y, completed May 18, 2018, 9 pages.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp. 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp. 188-191.
"Phase Change Material: DAPCM80-1",MH&W International Corp., May 2012, http://mhw-thermal.com, 1 pages.
Dow Coming_RTM. Two-Part RTV Silicone Sealant: Total Assembly Solutions for Home Appliance Production; www.dowcoming.com; Form No. 80-3375-01; 6 pages.
Evonik, Silanes for Adhesives and Sealants, 2013, p. 1-24.
Extended European Search Report issued in EP Application 15749120.0, dated Aug. 11, 2017, 6 pages.
International Preliminary Report on Patentability received for PCT Patent Application No. PCT/US17/41447, dated Feb. 7, 2019, 8 pages.
International Search Report and Written Opinion issued in PCT/CN2015/072202, dated Apr. 29, 2015, 14 pages.
International Search Report and Written Opinion issued in PCT/CN2016/075827, dated Dec. 1, 2016, 7 pages.
International Search Report and Written Opinion issued in PCT/CN2016/101874, dated Apr. 28, 2017, 12 pages.
International Search Report and Written Opinion issued in PCT/US2009/069090, dated Aug. 17, 2010, 6 pages.
International Search Report and Written Opinion issued in PCT/US2018/049218, ated Dec. 28, 2018, 13 pages.
International Search Report and Written Opinion issued in PCT/US2018/056870, dated Feb. 8, 2019, 9 pages.

(56) References Cited

OTHER PUBLICATIONS

International Search Report and Written Opinion received for PCT Patent Application No. PCT/US17/41447, dated Oct. 19, 2017, 10 pages.
International Search Report and Written Opinion received for PCT Patent Application No. PCT/US2018/049218, dated Dec. 28, 2018, 11 pages.
International Search Report and Written Opinion received for PCT Patent Application No. PCT/US2019/017743, dated May 28, 2019, 10 pages.
Search Report issued in Chinese patent application 201410411725X (with English Translation), report dated Jul. 6, 2016, 4 pages.
Singaporean Written Opinion issued in SG Application No. 11201704238Y, completed Apr. 11, 2019, 5 pages.
Wacker Silicones, Catalyst EP/Inhibitor PT 88 product data sheet, p. 1-3, Oct. 6, 2008.

* cited by examiner

THERMAL INTERFACE MATERIAL INCLUDING CROSSLINKER AND MULTIPLE FILLERS

CROSS-REFERENCE TO RELATED APPLICATION

This application is the U.S. national stage of PCT/CN2016/075827, published as WO 2017/152353, filed Mar. 8, 2016, the disclosure of which is hereby incorporated by reference herein in its entirety.

FIELD OF THE INVENTION

The present disclosure relates generally to thermal interface materials, and more particularly to thermal interface materials including a phase change material.

DESCRIPTION OF RELATED ART

Thermal interface materials are widely used to dissipate heat from electronic components, such as central processing units, video graphics arrays, servers, game consoles, smart phones, LED boards, and the like. Thermal interface materials are typically used to transfer excess heat from the electronic component to a heat spreader, then transfer heat to a heat sink.

FIG. 1 schematically illustrates an electronic chip 10, including a silicon die 12, a printed circuit board 14, and a plurality of flip chip joints 16 on the printed circuit board 14. The electronic chip 10 is illustratively connected to a heat spreader 18 and a heat sink 20 by one or more first thermal interface materials (TIM) 22. As illustrated in FIG. 1, a first TIM 22A connects the heat sink 20 and heat spreader 18 and a second TIM 22B connects the heat spreader 18 and silicon die 12 of electronic chip 10. One or both of thermal interface materials 22A, 22B may be a thermal interface material as described below.

TIM 22A is designated as a TIM 2 and is positioned between a heat spreader 18 and a heat sink 20, such that a first surface of TIM 22A is in contact with a surface of heat spreader 18 and a second surface of TIM 22A is in contact with a surface of heat sink 20.

TIM 22B is designated as a TIM 1 and is positioned between an electronic chip 10 and a heat spreader 18 such that a first surface of TIM 22B is in contact with a surface of electronic chip 34, such as a surface of silicon die 12, and a second surface of TIM 22B is in contact with a surface of heat spreader 18.

In some embodiments (not shown), the TIM 22 is designated as a TIM 1.5 and positioned between an electronic chip 10 and a heat sink 20, such that a first surface of TIM 22 is in contact with a surface of electronic chip 10, such as a surface of silicon die 12, and a second surface of TIM 2 is in contact with a surface of heat sink 22.

Thermal interface materials include thermal grease, grease-like materials, elastomer tapes, and phase change materials. Traditional thermal interface materials include components such as gap pads and thermal pads. Exemplary thermal interface materials are disclosed in the following patents and applications: CN 103254647, CN 103254647, JP 0543116, U.S. Pat. Nos. 6,238,596, 6,451,422, 6,500,891, 6,605,238, 6,673,434, 6,706,219, 6,797,382, 6,811,725, 6,874,573, 7,172,711, 7,147,367, 7,244,491, 7,867,609, 8,324,313, 8,586,650, U.S. 2005/0072334, U.S. 2007/0051773, U.S. 2007/0179232, U.S. 2008/0044670, U.S. 2009/0111925, U.S. 2010/0048438, U.S. 2010/0129648, U.S. 2011/0308782, US 2013/0248163, WO 2008/121491, and PCT/CN2014/093138.

Thermal greases and phase change materials have lower thermal resistance than other types of thermal interface materials because of the ability to be spread in very thin layers and provide intimate contact between adjacent surfaces. However, in some situations, the electronic chip 10 and heat sink 20 and/or heat spreader 18 are placed in a vertical orientation, such as shown in FIG. 2. In such a vertical orientation, an air gap 24 is positioned directly below TIM 22A and/or TIM 22B such that the TIM is not supported at a lower end. At higher temperatures the thermal interface materials, such as TIM 22A, 22B, may drip out of the interface through air gap 24 and on to other parts of the electronic component.

Improvements in the foregoing are desired.

SUMMARY OF THE INVENTION

The present disclosure provides thermal interface materials that are useful in transferring heat from heat generating electronic devices, such as computer chips, to heat dissipating structures, such as heat spreaders and heat sinks. The thermal interface materials illustratively include at least one phase change material, at least one polymer matrix material, one or more thermally conductive fillers, and at least one crosslinker, wherein the thermally conductive filler comprises at least 80 wt. % of the total weight of the thermal interface material, and the thermally conductive filler includes a first plurality of particles having a particle diameter less than 1 micron. In a more particular embodiment, the thermally conductive filler comprises at least 90 wt. %, 91 wt. %, 92 wt. %, 93 wt. %, or 95 wt. % of the total weight of the thermal interface material.

In one more particular embodiment of any of the above embodiments, the thermal interface material comprises 1 wt. % to 16 wt. % of at least one polymer matrix material; 0.5 wt. % to 8 wt. % of at least one phase change material; and 0.1 wt. % to 1 wt. % of at least one amine or amine-based crosslinker. In a more particular embodiment, the thermal interface material comprises 1 wt. % to 8 wt. % of at least one polymer matrix material; 0.5 wt. % to 5 wt. % of at least one phase change material; and 0.1 wt. % to 1 wt. % of at least one amine or amine-based crosslinker.

In one more particular embodiment of any of the above embodiments, the first plurality of particles comprises particles of zinc oxide. In an even more particular embodiment, the particles of zinc oxide have a diameter of 0.1 microns to about 1 micron. In another more particular embodiment, the particles of zinc oxide have a diameter of 0.9 micron or less.

In one more particular embodiment of any of the above embodiments, the thermally conductive filler further includes a second plurality of particles having a particle diameter greater than 1 micron. In an even more particular embodiment, the second plurality of particles comprises particles of aluminum. In a still more particular embodiment, the second plurality of particles comprises aluminum particles having a diameter of from about 3 microns to about 15 microns. In a yet still more particular embodiment, the second plurality of particles comprises a first portion of aluminum particles having a diameter of about 3 microns and a second portion of aluminum particles having a diameter about 10 microns.

In one more particular embodiment of any of the above embodiments, the crosslinker is an amine or amine-based crosslinker.

In one more particular embodiment of any of the above embodiments, the thermally conductive filler comprises from 91 wt. % to 95 wt. % of the total weight of the thermal interface material. In an even more particular embodiment, the thermally conductive filler comprises from 92 wt. % to 94 wt. % of the total weight of the thermal interface material.

In one more particular embodiment of any of the above embodiments, the thermal interface material further includes at least one coupling agent, such as a titanate coupling agent. In another more particular embodiment of any of the above embodiments, the thermal interface material further includes at least one antioxidant. In another more particular embodiment of any of the above embodiments, the thermal interface material further includes at least one ion scavenger. In another more particular embodiment of any of the above embodiments, the thermal interface material further includes at least one thixotropic agent.

In another embodiment, a formulation for forming a thermal interface material is provided. The formulation includes a solvent, at least one phase change material, at least one polymer matrix material, one or more thermally conductive filler, and at least one crosslinker, wherein the thermally conductive filler comprises at least 80 wt. % of the dry weight (solvent-free weight) of the thermal interface material, and the thermally conductive filler includes a first plurality of particles having a particle diameter less than 1 micron.

In another embodiment, an electronic component is provided. The electronic component includes a heat sink, an electronic chip, and a thermal interface material positioned between the heat sink and electronic chip, the thermal interface material including: at least one phase change material, at least one polymer matrix material, one or more thermally conductive filler, and at least one crosslinker, wherein the thermally conductive filler comprises at least 91 wt. % of the total weight of the thermal interface material, and the thermally conductive filler includes a first plurality of particles having a particle diameter less than 1 micron. The electronic chip and heat sink are positioned in a vertical orientation, and the thermal interface material is positioned in a vertical orientation between the vertically orientated electronic chip and heat sink.

In a more particular embodiment, a first surface of the thermal interface material is in contact with a surface of the electronic chip and a second surface of the thermal interface material is in contact with the heat sink. In another more particular embodiment, the electronic component includes a heat spreader positioned between the heat sink and the electronic chip, wherein a first surface of the thermal interface material is in contact with a surface of the electronic chip and a second surface of the thermal interface material is in contact with the heat spreader. In still yet another more particular embodiment, the electronic component includes a heat spreader positioned between the heat sink and the electronic chip, wherein a first surface of the thermal interface material is in contact with a surface of the heat spreader and a second surface of the thermal interface material is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

Figure 1:
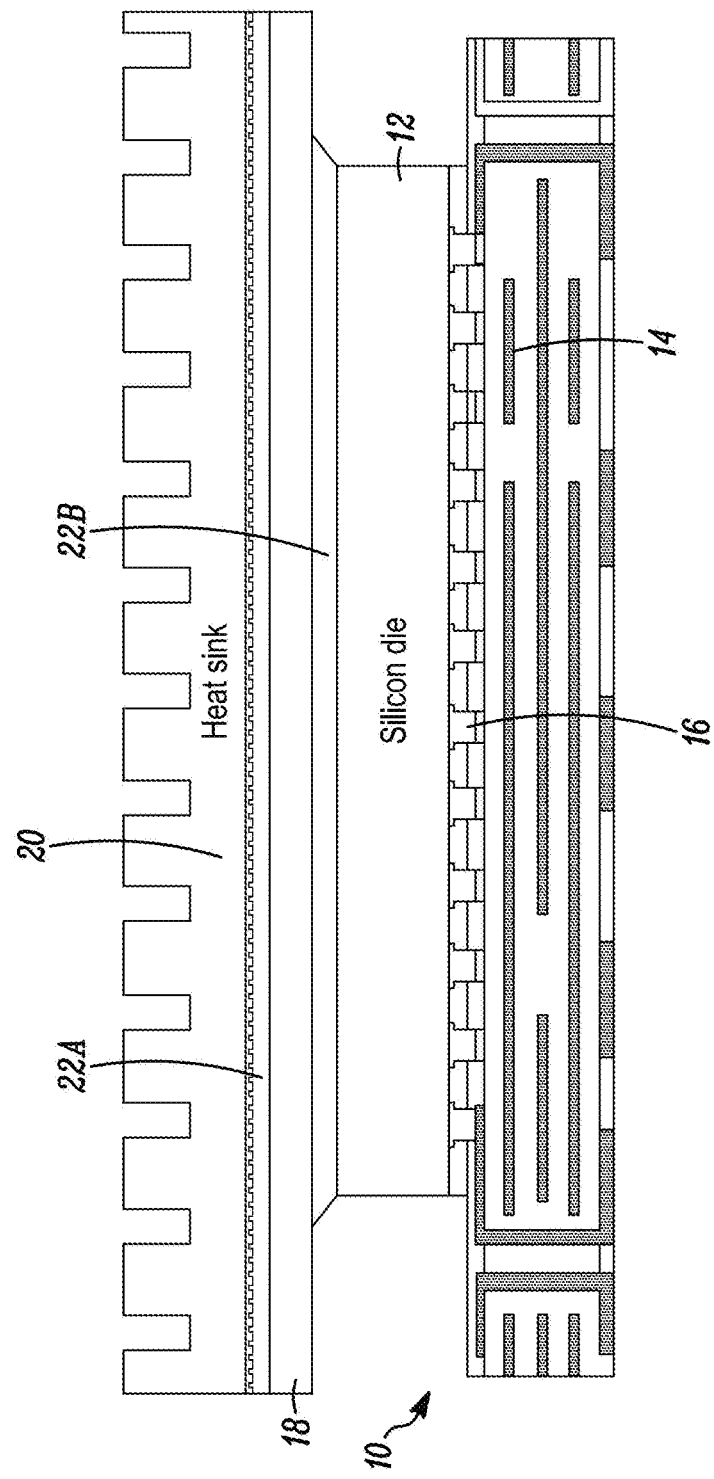
FIG. 1 schematically illustrates an electronic chip, a heat spreader, a heat sink, and first and second thermal interface materials.
Figure 2:
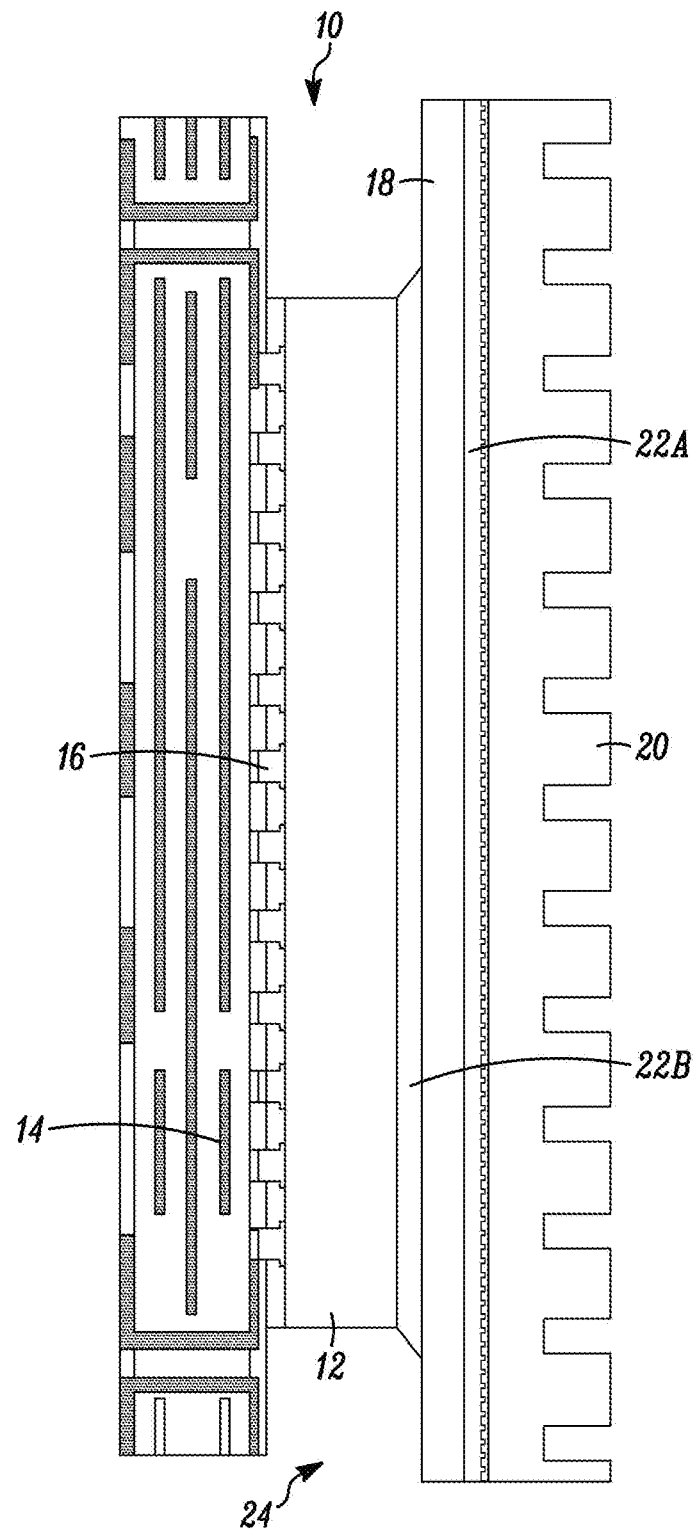
FIG. 2 schematically illustrates an electronic chip, a heat spreader, a heat sink, and first and second thermal interface materials of FIG. 1 in a vertical orientation.

The present invention relates to thermal interface materials useful in transferring heat away from electronic components.

A. Thermal Interface Material

In one exemplary embodiment, the TIM 22 is a thermal interface material. In some exemplary embodiments, TIM 22 comprises one or more phase change materials, one or more polymer matrix materials, one or more thermally conductive fillers, one or more crosslinkers, and, optionally, one or more additives.

a. Thermally Conductive Filler

In some exemplary embodiments, the TIM 22 includes at least one thermally conductive filler.

Exemplary thermally conductive fillers include metals, alloys, nonmetals, metal oxides, metal nitrides and ceramics, and combinations thereof. Exemplary metals include but are not limited to aluminum, copper, silver, zinc, nickel, tin, indium, lead, silver coated metals such as silver coated copper or silver coated aluminum, metal coated carbon fibers, and nickel coated fibers. Exemplary nonmetals include but are not limited to carbon, carbon black, graphite, carbon nanotubes, carbon fibers, graphene, powdered diamond, glass, silica, silicon nitride, and boron coated particles. Exemplary metal oxides, metal nitrides and ceramics include but are not limited to alumina, aluminum nitride, boron nitride, zinc oxide, and tin oxide.

The TIM 22 may comprise one or more thermally conductive fillers in a total amount as little as 80 wt. %, 85 wt. %, 90 wt. %, 91 wt. %, 91.5 wt. %, 92 wt. %, 92.5 wt. %, 93 wt. % as great as 93.5 wt. %, 94 wt. %, 95 wt. %, 96 wt. %, 97 wt. %, 98 wt. %, 99 wt. %, or within any range defined between any two of the foregoing values, based on the total weight of the TIM 22, such as 80 wt. % to 99 wt. %, 91 wt. % to 99 wt. %, 91 wt. % to 95 wt. %, or 92 wt. % to 94 wt. %.

The thermally conductive fillers may be provided as particles. Average particle diameter (D50) is commonly used to measure particle size. Illustrative particles have average particle diameters as little as 10 nm, 20 nm, 50 nm, 0.1 microns, 0.2 microns, 0.5 microns, 1 micron, 2 microns, 3 microns, as great as 5 microns, 8 microns, 10 microns, 12 microns, 15 microns 20 microns, 25 microns, 50 microns, 100 microns, or within any range defined between any two of the foregoing values, such as 10 nm to 100 microns, 0.1 microns to 20 microns, or 0.5 microns to 12 microns.

In one embodiment, a first thermally conductive filler has a particle diameter as little as 1 micron, 0.9 microns, 0.8 microns, 0.6 microns, 0.5 microns, 0.2 microns, 0.1 microns, or less, or within any range defined between any two of the foregoing values, such as 1 micron to 0.1 microns, 1 micron to 0.2 microns, or 1 micron to 0.8 microns. In a more particular embodiment, the first thermally conductive filler includes a plurality of zinc oxide particles having a diameter of 1 micron or less.

In one embodiment, a second thermally conductive filler provided with the first thermally conductive filler has a particle diameter as little as 1 micron, 2 microns, 3 microns, 4 microns, as great as 6 microns, 8 microns, 10 microns, or 12 microns, or within any range defined between any two of the foregoing values, such as 1 micron to 12 microns, 3 microns to 10 microns, 2 microns to 4 microns, or 8 microns to 12 microns. In a more particular embodiment, the second thermally conductive filler is comprised of particles having a mixture of particle sizes greater than 1 micron, including particles having a diameter as little as 2 microns, 3 microns, 4 microns, as great as 6 microns, 8 microns, 10 microns, or 12 microns, or mixtures thereof. In a more particular embodiment, the first thermally conductive filler includes a plurality of aluminum particles having a diameter greater than 1 micron.

In a more particular embodiment, the second thermally conductive filler includes a plurality of particles having a diameter greater than 1 micron, the first thermally conductive filler includes a plurality of particles having a diameter of 1 micron or less, and a weight ratio of the second thermally conductive filler to the first thermally conductive filler is as little as 0.5:1, 1:1, 1.25:1, 1.5:1, 2:1, 2.5:1, as great as 2.75:1, 3:1, 5:1, 10:1, 20:1, or within any range defined between any two of the foregoing values, such as 0.5:1 to 20:1, 1:1 to 10:1, 1.25:1 to 5:1, or 2.5:1 to 3:1.

In a more particular embodiment, the thermally conductive filler includes a plurality of aluminum particles having a particle diameter as little as 1 micron, 2 microns, 3 microns, as great as 5 microns, 8 microns, 10 microns, 12 microns, 15 microns, or within any range defined between any two of the foregoing values, such as 1 micron to 15 microns or 2 microns to 12 microns, or 3 microns to 10 microns and a plurality of zinc oxide particles having a particle diameter of one micron or less.

b. Polymer Matrix Material

In some exemplary embodiments, the TIM 22 comprises a polymer matrix material. In some exemplary embodiments, the polymer matrix material provides a matrix for incorporating the thermally conductive fillers, and provides flowability when pressed under heat and pressure.

In one exemplary embodiment, the polymer matrix material comprises a hydrocarbon rubber compound or a blend of rubber compounds. Exemplary materials include saturated and unsaturated rubber compounds. In some embodiments, saturated rubbers may be less sensitive to thermal oxidation degradation than unsaturated rubber compounds. Exemplary saturated rubber compounds include ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene dial) and hydrogenated polyisoprene, polyolefin elastomer, or any other suitable saturated rubber, or blends thereof. In one embodiment, the polymer matrix material is a hydrogenated polybutadiene mono-ol, which may also be referred to as a hydroxyl-terminated ethylene butylene copolymer, specialty mono-ol.

In one exemplary embodiment, the polymeric matrix material comprises a silicone rubber, a siloxane rubber, a siloxane copolymer or any other suitable silicone-containing rubber.

In some exemplary embodiments, the TIM 22 may comprise the polymer matrix material in an amount as little as 0.5 wt. %, 1 wt. %, 2 wt. %, 3 wt. %, 4 wt. % as great as 5 wt. %, 6 wt. %, 7 wt. %, 8 wt. %, 10 wt. %, 12 wt. %, 16 wt. % or within any range defined between any two of the foregoing values, based on the total weight of the TIM 22, such as 1 wt. % to 16 wt. %, 1 wt. % to 8 wt. %, or 4 wt. % to 6 wt. %.

c. Phase Change Material

In some exemplary embodiments, the TIM 22 comprises one or more phase change materials. A phase change material is a material having a melting point or melting point range at or below the operating temperature of a portion of an electronic device in which the TIM 22 is to be used. An exemplary phase change material is a wax, such as paraffin wax. Paraffin waxes are a mixture of solid hydrocarbons having the general formula $C_nH_{2n+2}$ and having melting points in the range of about 20° C. to 100° C. Polymer waxes include polyethylene waxes and polypropylene waxes, and typically have a range of melting points from about 40° C. to 160° C. Other exemplary phase change materials include low melting alloys, such as Wood's metal, Field's metal, or a metal or alloy having a melting point between about 20° C. and 90° C.

In some embodiments, the amount of phase change material can be used to adjust the hardness of the TIM 22. For example, in some embodiments wherein the loading of the phase change material is low, the composition may be in the form of a soft gel, and in some embodiments wherein the loading of the phase change material is high, the composition may be a hard solid. The TIM 22 may comprise the one or more phase change materials in an amount in an amount as little as 0.1 wt. %, 0.2 wt. %, 0.5 wt. %, 1 wt. %, 2 wt. %, as great as 3 wt. %, 3.5 wt. %, 4 wt. %, 5 wt. %, 7 wt. %, 8 wt. %, 10 wt. %, 12 wt. %, or within any range defined between any two of the foregoing values, based on the total weight of the TIM 22, such as 0.1 wt. % to 10 wt. %, 0.5 wt. % wt. % to 8 wt. %, or 0.5 wt. % to 5 wt. %.

d. Coupling Agent

In some exemplary embodiments, the TIM 22 comprises one or more coupling agents. In some exemplary embodiments, inclusion of a coupling agent may improve thermal properties, such as properties at relatively high temperatures by providing an interface between the polymer matrix and the thermally conductive filler. Exemplary coupling agents include titanate coupling agents, such as those disclosed in US Patent Application Publication 2011/0308782, the disclosure of which is hereby incorporated by reference in its entirety. Exemplary coupling agents include:

titanium IV 2,2 (bis 2-propenolatomethyl)butanolato, tris (dioctyl)pyrophosphato-O;

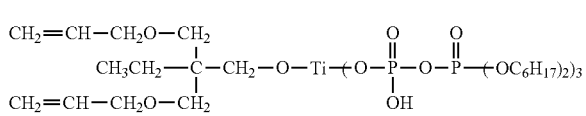

zirconium IV 2,2 (bis 2-propenolatomethyl)butanolato, tris(diisooctyl)pyrophosphato-O:

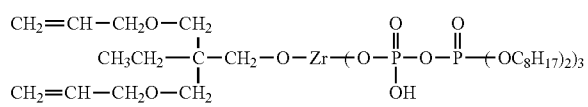

titanium IV 2-propanolato, tris(dioctyl)-pyrophosphato-O) adduct with 1 mole of diisooctyl phosphite:

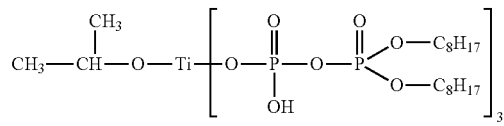

titanium IV bis(dioctyl)pyrophosphato-O, oxoethylenediolato, (Adduct), bis(dioctyl) (hydrogen)phosphite-O:

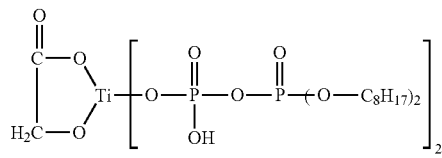

titanium IV bis(dioctyl)pyrophosphato-O, ethylenediolato (adduct), bis(dioctyl)hydrogen phosphite;

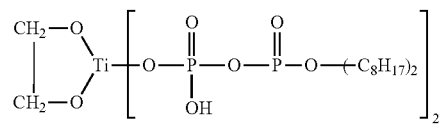

and zirconium IV 2,2-bis(2-propenolatomethyl) butanolato, cyclo di[2,2-(bis 2-propenolatomethyl) butanolato], pyrophosphato-O,O:

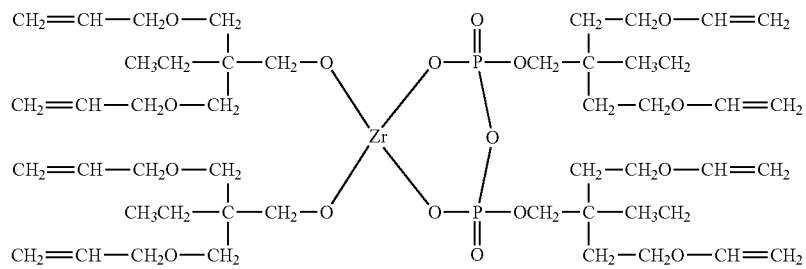

In one exemplary embodiment, the coupling agent is titanium IV 2, 2 (bis 2-propenolatomethyl) butanolato, tris (dioctyl)pyrophosphato-0.

In some exemplary embodiments, the TIM 22 may comprise the one or more coupling agents in an amount as little as 0.1 wt. %, 0.2 wt. %, 0.3 wt. %, 0.5 wt. %, as great as 1 wt. %, 2 wt. %, 3 wt. %, 5 wt. %, or within any range defined between any two of the foregoing values, based on the total weight of the TIM 22, such as 0.1 wt. % to 5 wt. %, 0.2 wt. % to 2 wt. %, or 0.2 wt. % to 1 wt. %.

e. Crosslinkers

In some exemplary embodiments, the TIM 22 comprises one or more crosslinkers, such as amine or amine-based resins. Crosslinkers are added or incorporated into the thermal interface material composition to facilitate a crosslinking reaction between the crosslinker and the primary or terminal hydroxyl groups on at least one of the polymer matrix materials. Exemplary crosslinkers are disclosed in U.S. Pat. No. 7,244,491, the disclosure of which is hereby incorporated by reference in its entirety.

In one exemplary embodiment, the crosslinker is an amine or amine-based resin that comprises at least one amine substituent group on any part of the resin backbone. Exemplary amine and amine-based resins include alkylated melamine resins and synthetic resins derived from the reaction of urea, thiourea, melamine or allied compounds with aldehydes, particularly formaldehyde. In a more particular embodiment, the crosslinker is a resin selected from the group consisting of primary amine resins, secondary amine resins, tertiary amine resins, glycidyl amine epoxy resins, alkoxybenzyl amine resins, epoxy amine resins, melamine resins, alkylated melamine resins, and melamine-acrylic resins.

In one exemplary embodiment, the crosslinker is a melamine resin, such as an alkylated melamine resin, or even more particularly a butylated melamine resin. Melamine resins are ring-based compounds, whereby the ring contains three carbon and three nitrogen atoms. Melamine resins typically combine easily with other compounds and molecules through condensation reactions. Melamine resins typically can react with other molecules and compounds to facilitate chain growth and crosslinking, are more water resistant and heat resistant than urea resins, can be used as water-soluble syrups or as insoluble powders dispersible in water, and have high melting points (greater than 325° C.) and are relatively non-flammable). Alkylated melamine resins, such as butylated melamine resins, are formed by incorporating alkyl alcohols during the resin formation. They are soluble in paint and enamel solvents and in surface coatings.

In some exemplary embodiments, the TIM 22 may comprise the one or more crosslinkers in an amount as little as 0.1 wt. %, 0.2 wt. %, 0.3 wt. %, 0.5 wt. %, as great as 1 wt. %, 2 wt. %, 3 wt. %, 5 wt. %, or within any range defined between any two of the foregoing values, based on the total weight of the TIM 22, such as 0.1 wt. % to 5 wt. %, 0.2 wt. % to 2 wt. %, or 0.2 wt. % to 1 wt. %.

f. Additives

In some exemplary embodiments, the TIM 22 comprises one or more additives. Exemplary additives include antioxidants, ion scavengers, and thixotropic agents.

In one exemplary embodiment, an antioxidant inhibits thermal degradation of the polymer matrix by transferring elections of a free radical to an oxidizing agent. Exemplary antioxidants include phenolic-type antioxidants, amine-type antioxidants, or any other suitable type of antioxidant or combinations thereof, such as a sterically hindered phenol or amine type antioxidant. Exemplary antioxidants include phenol type antioxidants such as Irganox® 1076, or octadecyl 3-(3,5-di-(tert)-butyl-4-hydroxyphenyl) propionate; amine type antioxidants such as Irganox® 565, or 2,6-di-tert-butyl-4-(4,6-bis(octylthio)-1,3,5-triazin-2-ylamino) phenol, and sulfur containing phenolic antioxidants, such as a sterically hindered sulfur containing phenolic antioxidant. Other exemplary antioxidants include:

Irganox® 1010:

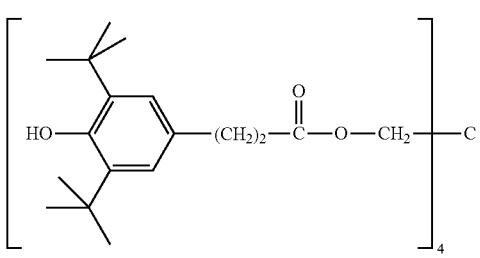

N-salicylidene-N'salicyloyl hydrazide:

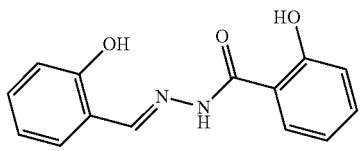

N,N'-bis(salicyloyl)hydrazine:

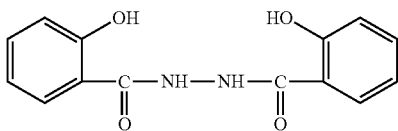

Irgafos 168®:

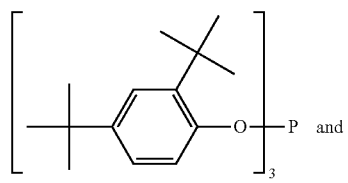

and

Irganox® 802:

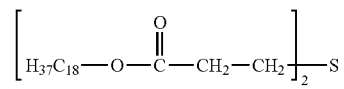

In some exemplary embodiments, the TIM 22 may comprise the one or more antioxidants in an amount as little as 0.05 wt. %, 0.1 wt. %, 0.2 wt. %, 0.5 wt. %, as great as 1 wt. % 1.5 wt. %, 2 wt. %, 5 wt. %, or within any range defined between any two of the foregoing values, based on the total weight of the TIM, such as 0.05 wt. % to 5 wt. %, 0.1 wt. % to 2 wt. %, or 0.1 wt. % to 1 wt. %.

In one exemplary embodiment, an ion scavenger inhibits thermal degradation of the polymer matrix by capturing and binding metal ions such that they cannot initiate the formation of free radicals in the polymer. Exemplary ion scavengers are disclosed in PCT application number PCT/CN2014/081724, the disclosure of which is hereby incorporated by reference in its entirety. Exemplary ion scavengers include:

oxalyl bis(benzylidenehydrazide):

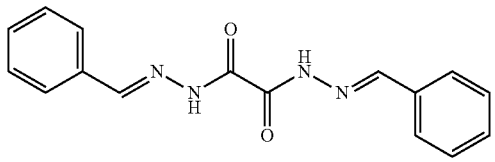

3-(N-salicyloyl)amino-1,2,4-triazole:

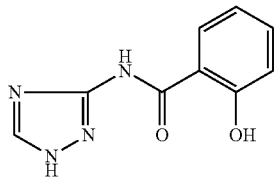

2,2'-oxamido bis[ethyl 3-(3,5-di-tert-butyl-4-hydroxyphenyl)propionate]

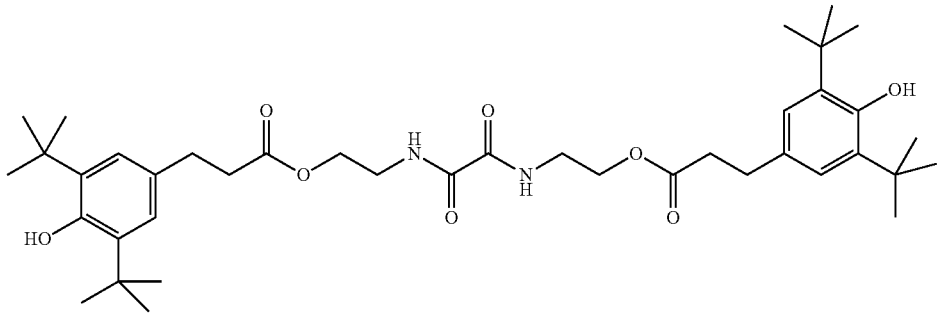

N,N'-bis(salicylidene) ethylenediamine:

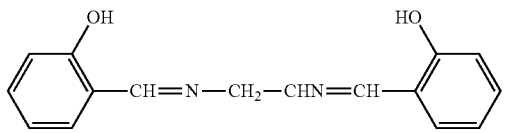

Oxanilide:

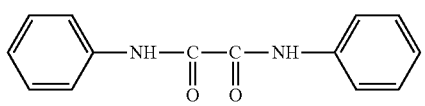

N-formyl-N'-salicyloyl hydrazine:

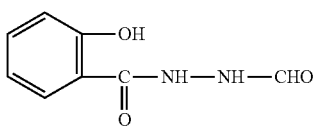

2',3-bis[[3-[3,5-di-tert-butyl-4-hydroxyphenyl]propionic]]propionyl hydrazide:

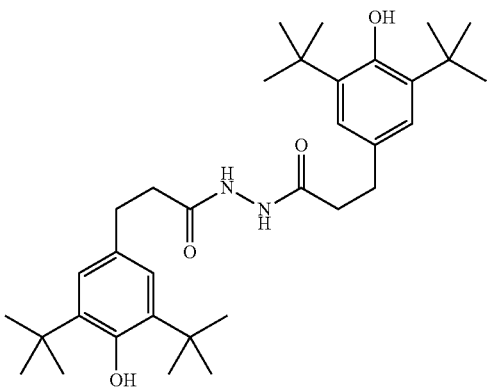

Methylmalonic acid dianilide:

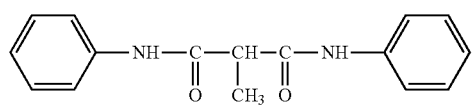

Decamethylenedicarboxylic acid disalicyloylhydrazide:

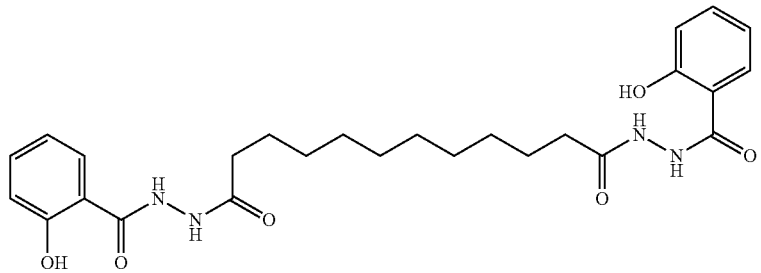

and Bis(2,6-di-ter-butyl-4-methylphenyl)pentaerythritol-diphosphite:

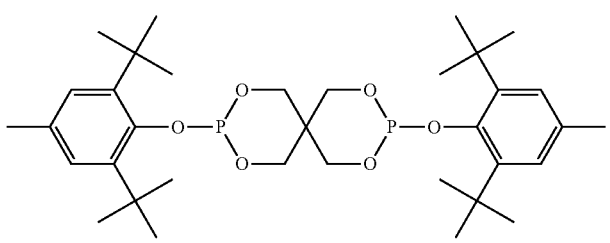

In some exemplary embodiments, the TIM 22 may comprise the one or more ion scavengers in an amount as little as 0.05 wt. %, 0.1 wt. %, 0.2 wt. %, 0.5 wt. %, as great as 0.6 wt. %, 1 wt. % 1.5 wt. %, 2 wt. %, 5 wt. %, or within any range defined between any two of the foregoing values, based on the total weight of the TIM, such as 0.05 wt. % to 5 wt. %, 0.1 wt. % to 1 wt. %, or 0.1 wt. % to 0.6 wt. %.

Exemplary thixotropic agents include fumed silica and cellulose. In some exemplary embodiments, the TIM 22 may comprise the one or more thixotropic agents in an amount as little as 0.1 wt. %, 0.2 wt. %, 0.3 wt. %, 0.5 wt. %, as great as 1 wt. %, 2 wt. %, 3 wt. %, 5 wt. %, or within any range defined between any two of the foregoing values, based on the total weight of the TIM 22, such as 0.1 wt. % to 5 wt. %, 0.2 wt. % to 2 wt. %, or 0.2 wt. % to 1 wt. %.

B. Methods of Forming a Thermal Interface Material

In some embodiments, the TIM 22 is formed from a dispensable formulation including one or more polymer matrix materials, one or more phase change materials, two or more thermally conductive fillers, one or more solvents, and, optionally, one or more additives.

Exemplary solvents are described in U.S. Patent Application Publication 2007/0517733, the disclosure of which is hereby incorporated by reference herein in its entirety. Suitable solvents include pure solvents or mixtures of organic or inorganic solvents that are volatilized at a desired temperature, such as the critical temperature, or that can facilitate any of the above-mentioned design goals or needs, and that are compatible with the phase change materials, in that they will interact with the phase change materials to achieve the previously-mentioned goals. In some embodiments, the solvent, solvent mixture or combination thereof will solvate the phase change material such that it can be applied by printing techniques. In some exemplary embodiments, the solvent or mixture of two or more solvents are selected from the hydrocarbon family of solvents. Hydrocarbon solvents comprise carbon and hydrogen. A majority of hydrocarbon solvents are non-polar; however, there are a few hydrocarbon solvents that are considered polar.

Hydrocarbon solvents are generally classified into three classes: aliphatic, cyclic and aromatic. Aliphatic hydrocarbon solvents comprise both straight-chain compounds and compounds that are branched and possibly crosslinked, however, aliphatic hydrocarbon solvents are not typically considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. In some exemplary embodiments, the solvent or mixture of two or more solvents are selected from solvents that are not considered part of the hydrocarbon solvent family of compounds, such as ketones, alcohols, esters, ethers and amines. In yet other contemplated embodiments, the solvent or solvent mixture may comprise a combination of any of the solvents mentioned herein.

Exemplary hydrocarbon solvents include toluene, xylene, p-xylene, m-xylene, mesitylene, solvent naphtha H, solvent naphtha A, Isopar H and other paraffin oils and isoparaffinic fluids, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroine. Exemplary ketone solvents include acetone, diethyl ketone, methyl ethyl ketone and the like.

In one exemplary embodiment, the solvent includes one or more solvents selected from: pentane, hexane, heptane, cyclohexane, paraffin oils, isoparaffinic fluids, benzene, toluene, xylene and mixtures or combinations thereof.

In some exemplary embodiments, the formulation may comprise the one or more solvents in an amount as little as 0.1 wt. %, 0.5 wt. %, 1 wt. % as great as 5 wt. %, 10 wt. %, 20 wt. %, or within any range defined between any two of the foregoing values, based on the total weight of the formulation.

In some exemplary embodiments, a method of forming a TIM 22 is provided. In some exemplary embodiments, forming the TIM 22 includes processes such as baking and drying the TIM 22.

In some exemplary embodiments, baking the TIM 22 include baking at a temperature as low as 25° C., 50° C., 75° C., 80° C., as high as 100° C., 125° C., 150° C., 170° C., or within any range defined between any two of the foregoing values. In some exemplary embodiments, the TIM 22 is baked for as little as 0.5 minutes, 1 minute, 30 minutes, 1 hour, 2 hours, as long as 8 hours, 12 hours, 24 hours, 36, hours, 48 hours, or within any range defined between any two of the foregoing values.

C. Thermal Interface Material Properties

In some exemplary embodiments, the TIM 22 has a thermal impedance as little as 0.05° C.·cm$^2$/W, 0.06° C.·cm$^2$/W, 0.07° C.·cm$^2$/W, as high as 0.08° C.·cm$^2$/W, 0.09° C.·cm$^2$/W, 0.1° C.·cm$^2$/W, 0.12° C.·cm$^2$/W, or within any range defined between any two of the foregoing values, such as 0.05° C.·cm$^2$/W to 0.12° C.·cm$^2$/W, 0.06° C.·cm$^2$/W to 0.1° C.·cm$^2$/W, or 0.06° C.·cm$^2$/W to 0.08° C.·cm$^2$/W.

In some exemplary embodiments, the TIM 22 has a thermal impedance following conditioning at a temperature of 130° C. and a relative humidity of 85% for 96 hours that is no more than 20% greater, no more than 10% greater, no more than 5% greater, or no more than the thermal impedance of the TIM 22 prior to said conditioning.

In some exemplary embodiments, the TIM 22 has a thermal impedance following conditioning at a temperature of 150° C. for 1000 hours that is no more than 20% greater, no more than 10% greater, no more than 5% greater, or no more than the thermal impedance of the TIM 22 prior to said conditioning.

The final thickness of the applied TIM, following application between the heat generating and heat dissipating components, is referred to as the bond line thickness (BLT). The value of the BLT is determined, in part, by the flowability of the TIM when being heated by the heat generating component. Phase change materials (PCM) include a wax or other material to be increase the flowability of the TIM when heated by the heat generating component, which in turn reduced the BLT. BLT is related to thermal impedance (TI) and thermal conductivity (TC) by the formula TI=BLT/TC, such that lower BLT results in lower thermal impedance at the same thermal conductivity. Without wishing to be bound by any particular theory, it is believed that including multiple sizes of thermally conductive fillers allows smaller particle sizes to fill gaps present between larger particle sizes, increasing the flowability of the TIM and reducing the BLT. TIM formulations having low BLT tend to have low thermal impedance.

In some embodiments, when subjected to a pressure of 40 psi and heated to 80° C., the TIM 22 has a bond line thickness as great as 80 microns, 70 microns, 60 microns, 50 microns, 40 microns, as little as 30 microns, 25 microns, 20 microns, 15 microns, 10 microns, 5 microns, or less, or within any range defined between any two of the foregoing values, such as from 80 microns to 5 microns, from 60 microns to 10 microns, or from 30 to 20 microns.

In some embodiments, the TIM 22 resists dripping at elevated temperature. In one exemplary dripping test, a TIM 22 composition is applied at a thickness of about 0.6 mm between two metal bars and subjected to about 30 psi of pressure. The TIM 22 interface between the metal is positioned vertically and subjected to 120° C. temperature for two days. Any TIM 22 material dripping from the interface during the two days indicates a failed baking test. The sample is then cycled 90 times between −55° C. and 125° C. Any TIM 22 material dripping from the interface during the cycling indicates a failed cycling test.

Examples

Examples were prepared according to the compositions indicated in Table 1. As shown in Table 1, Example 1 included a melamine resin crosslinker and about 91.9 wt. % total thermally conductive filler comprised of aluminum particles having a diameter greater than 1 micron and zinc oxide particles having a diameter less than 1 micron. Comparative Example 1 lacked the melamine resin crosslinker, included only about 90.8 wt. % total thermally conductive filler, and did not include any particles having a diameter less than 1 micron. Comparative Example 2 included the melamine resin crosslinker, but had only about 89.8 wt. % total thermally conductive filler, and did not include any particles having a diameter less than 1 micron. Comparative Example 3 lacked the melamine resin crosslinker, but included about 93.0 wt. % total thermally conductive filler comprised of aluminum particles having a diameter greater than 1 micron and zinc oxide particles having a diameter less than 1 micron.

TABLE 1

Example compositions

| | Comp. Ex. 1 | Comp. Ex. 2 | Comp. Ex. 3 | Example 1 |
|---|---|---|---|---|
| Polymer - Hydrogenated polybutadiene mono-ol | 6.22 g | 6.15 g | 4.6 g | 4.56 g |
| First thermally conductive filler - Al particles with diameter of 2-15 μm | 90.83 g | 89.84 g | 67.13 g | 66.33 g |
| Second thermally conductive filler - ZnO particles with diameter of <1 μm | — | — | 25.88 g | 25.56 g |
| Phase change material - wax | 1.78 g | 1.76 g | 1.31 g | 1.30 g |
| Titanium coupling agent | 0.67 g | 0.66 g | 0.72 g | 0.70 g |
| Melamine resin crosslinker | — | 0.59 g | — | 0.59 g |
| Antioxidant | 0.5 g | 0.51 g | 0.36 g | 0.36 g |
| Ion scavenger | — | 0.49 g | — | 0.60 g |

Each TIM was sandwiched between two metal plates oriented with the interface in the vertical direction and subjected to 30 psi. The original thickness for each sample was about 0.6 mm, as shown in Table 2.

Each sample was subjected a baking test of 120° C. temperature for two days. Any TIM material dripping from the interface during the two days indicates a failed baking test. Each sample was then subjected to a Thermal Cycling test of 90 temperature cycles from −55° C. to 125° C. over two and a half days. Any TIM material dripping from the interface during the cycling indicates a failed Thermal cycling test.

TABLE 2

Drip test results

| | Original thickness (mm) | Baking result | Thermal cycling result |
|---|---|---|---|
| Comp. Ex. 1 | 0.568 | Fail | Fail |
| Comp. Ex. 2 | 0.56 | Fail | Fail |
| Comp. Ex. 3 | 0.634 | Pass | Fail |
| Example 1 | 0.6 | Pass | Pass |

As shown in Table 2, only Example 1, which included a submicron thermally conductive filler and a crosslinker, passed both the baking test and the Thermal Cycling temperature cycling test. Comparative Examples 1 and 2, which included the crosslinker but lacked the submicron filler, failed both the baking result test and the Thermal Cycling cycling test. Comparative Example 3, which included the submicron filler but lacked the crosslinker, passed the baking test, but failed the Thermal Cycling cycling test. Example 1 had better anti-drip properties than any of the comparative examples.

Each TIM was then subjected to a thermal reliability test. Each sample was sandwiched in a mold at 90 degrees C. for 1 hour, and the original thermal impedance and thickness (bond line thickness) were measured. For Comparative Example 1, Comparative Example 2, and Ex. 1, the first two samples of each material were pressed with 35 psi, while the third sample was baked without pressure. For Comparative Example 3, no pressure was applied to any of the three samples.

Each sample was baked at 260° C. for 10 minutes, after which time the samples were cleaned and thermal impedance retested. For Ex. 1, samples were also backed for 20 minutes, after which time they were cleaned and the thermal impedance retested. A smaller change in the thermal impedance following baking is desirable.

TABLE 2

Thermal reliability results

| | BLT (mm) | Beginning TI (° C. · cm$^2$/W) | Pressure during baking | TI after 10 min @260° C. | TI after 20 min @260° C. |
|---|---|---|---|---|---|
| Comp. Ex. 1 | 0.028 | 0.09 | 35 psi | 0.16 | — |
| Comp. Ex. 1 | 0.024 | 0.09 | 35 psi | 0.17 | — |
| Comp. Ex. 1 | 0.025 | 0.09 | 0 psi | 0.54 | — |
| Comp. Ex. 2 | 0.027 | 0.09 | 35 psi | 0.14 | — |
| Comp. Ex. 2 | 0.027 | 0.10 | 35 psi | 0.19 | — |
| Comp. Ex. 2 | 0.031 | 0.11 | 0 psi | 0.80 | — |
| Comp. Ex. 3 | 0.019 | 0.06 | 0 psi | 0.61 | — |
| Comp. Ex. 3 | 0.027 | 0.08 | 0 psi | 0.80 | — |
| Comp. Ex. 3 | 0.034 | 0.09 | 0 psi | 0.89 | — |
| Example 1 | 0.019 | 0.09 | 35 psi | 0.09 | 0.08 |
| Example 1 | 0.023 | 0.08 | 35 psi | 0.08 | 0.07 |
| Example 1 | 0.023 | 0.11 | 0 psi | 0.15 | 0.15 |

As shown in Table 3, only Example 1, which included a submicron thermally conductive filler and a crosslinker, provided good results in both the pressed (35 psi) and unpressed (0 psi) results. The thermal impedance of Example 1 was shown to be relatively constant even after 20 minutes at 26° C. Comparative Examples 1 and 2, which included the crosslinker but lacked the submicron filler, showed increases in thermal impendence for the pressed (35 psi), and substantial increases in thermal impedance for the unpressed (0 psi). Comparative Example 3, which included the submicron filler but lacked the crosslinker, showed a substantial increase in thermal impedance for the unpressed (0 psi). Accordingly, Example 1 provided better reliability than any of the comparative examples.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A thermal interface material comprising:
   1 wt. % to 16 wt. % of at least one polymer matrix material;
   0.5 wt. % to 8 wt. % of at least one phase change material;
   0.1 wt. % to 1 wt. % of at least one amine or amine-based crosslinker; and
   a thermally conductive filler including a first plurality of zinc oxide particles having an average particle diameter of about 0.1 microns to about 1 micron; and a second plurality of particles of aluminum having an average particle diameter of about 2 microns to about 12 microns, and wherein a weight ratio of the aluminum particles to the zinc oxide particles is from 1.25:1 to 5:1; and
   wherein the at least one thermally conductive filler comprises at 80 wt. % of the total weight of the thermal interface material.

2. The thermal interface material of claim 1, wherein the amine or amine-based crosslinker is an alkylated melamine resin.

3. The thermal interface material of claim 1, wherein the thermal interface material comprises:
- 1 wt. % to 8 wt. % of the at least one polymer matrix material;
- 0.5 wt. % to 5 wt. % of the at least one phase change material;
- 0.1 wt. % to 1 wt. % of the at least one amine or amine-based crosslinker; and
- 91 wt. % to 95 wt. % of the at least one thermally conductive filler, based on the total weight of the thermal interface material.

4. The thermal interface material of claim 1, wherein the polymer matrix material comprises a hydrogenated polyalkyldiene mono-ol.

5. The thermal interface material of claim 1, wherein the phase change material comprises a paraffin wax.

6. The thermal interface material of claim 1, further comprising at least one coupling agent, antioxidant, ion scavenger, or thixotropic agent.

7. A dispensable formulation for forming a thermal interface material, the dispensable formation comprising:
- 0.1 wt. % to 20 wt. % of at least one solvent, based on the total weight of the dispensable formulation;
- 1 wt. % to 16 wt. % of at least one polymer matrix material based on the dry-weight of the formed thermal interface material;
- 0.5 wt. % to 8 wt. % of at least one phase change material based on the dry-weight of the formed;
- 0.1 wt. % to 1 wt. % of at least one amine or amine-based crosslinker based on the dry-weight of the formed thermal interface material; and
- a thermally conductive filler including a first plurality of zinc oxide particles having an average particle diameter of about 0.1 microns to about 1 micron; and a second plurality of particles of aluminum having an average particle diameter of about 2 microns to about 12 microns, and wherein a weight ratio of the aluminum particles to the zinc oxide particles is from 1.25:1 to 5:1; and
- wherein the at least one thermally conductive filler comprises at least 80 wt. % based on the dry-weight of the formed thermal interface material.

8. The dispensable formulation of claim 7, wherein the amine or amine-based crosslinker is an alkylated melamine resin.

9. The dispensable formulation of claim 7, wherein the at least one thermally conductive filler comprises:
- 1 wt. % to 8 wt. % of the at least one polymer matrix material;
- 0.5 wt. % to 5 wt. % of the at least one phase change material;
- 0.1 wt. % to 1 wt. % of the at least one amine or amine-based crosslinker; and
- 91 wt. % to 95 wt. % of the at least one thermally conductive filler based on the dry-weight of the formed thermal interface material.

10. An electronic component comprising:
- a heat sink;
- an electronic chip;
- a thermal interface material positioned between the heat sink and electronic chip in a vertical orientation, the thermal interface material including:
  - 1 wt. % to 16 wt. % of at least one polymer matrix material;
  - 0.5 wt. % to 8 wt. % of at least one phase change material;
  - 0.1 wt. % to 1 wt. % of at least one amine or amine-based crosslinker; and
  - a thermally conductive filler including a first plurality of zinc oxide particles having an average diameter of about 0.1 microns to about 1 micron particles and a second plurality of aluminum particles having an average particle diameter of about 2 microns to about 12 microns, and wherein a weight ratio of the aluminum particles to the zinc oxide particles is from 1.25:1 to 5:1;
- wherein the at least one thermally conductive filler comprises at least 80 wt. % of the total weight of the thermal interface material.

11. The electronic component of claim 10, wherein the amine or amine-based crosslinker is an alkylated melamine resin.

12. The electronic component of claim 10, wherein the at least one thermally conductive filler comprises:
- 1 wt. % to 8 wt. % of the at least one polymer matrix material;
- 0.5 wt. % to 5 wt. % of the at least one phase change material;
- 0.1 wt. % to 1 wt. % of the at least one amine or amine-based crosslinker; and
- 91 wt. % to 95 wt. % of the at least one thermally conductive filler, based on the total weight of the thermal interface material.

13. The thermal interface material of claim 1, wherein the weight ratio of the aluminum particles to the zinc oxide particles is from 2.5:1 to 3:1.

14. The formulation of claim 1, wherein the weight ratio of the aluminum particles to the zinc oxide particles is from 2.5:1 to 3:1.

15. The electronic component of claim 1, wherein the weight ratio of the aluminum particles to the zinc oxide particles is from 2.5:1 to 3:1.

* * * * *